United States Patent
Boraas et al.

(10) Patent No.: US 8,900,503 B2
(45) Date of Patent: Dec. 2, 2014

(54) METHOD OF FORMING AN OVERMOLDED DUAL IN-LINE MEMORY MODULE COOLING STRUCTURE

(75) Inventors: Michael A. Boraas, Zumbrota, MN (US); Vinod Kamath, Raleigh, NC (US); Michael S. Miller, Raleigh, NC (US); Mark E. Steinke, Durham, NC (US); Jamil A. Wakil, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 13/247,275

(22) Filed: Sep. 28, 2011

(65) Prior Publication Data

US 2013/0074339 A1 Mar. 28, 2013

(51) Int. Cl.
*B29C 45/14* (2006.01)

(52) U.S. Cl.
USPC .................. 264/272.17; 264/264; 264/275

(58) Field of Classification Search
None
See application file for complete search history.

(56) References Cited

U.S. PATENT DOCUMENTS

| | | | |
|---|---|---|---|
| 4,720,424 A | | 1/1988 | Eickman et al. |
| 5,280,193 A | * | 1/1994 | Lin et al. .................... 257/723 |
| 5,371,404 A | | 12/1994 | Juskey et al. |
| 5,399,416 A | | 3/1995 | Bujard |
| 5,619,067 A | | 4/1997 | Sua et al. |
| 6,408,935 B1 | | 6/2002 | DeHoff et al. |
| 6,534,711 B1 | * | 3/2003 | Pollack ...................... 174/529 |
| 6,600,651 B1 | * | 7/2003 | Weng ........................ 361/700 |
| 6,610,560 B2 | * | 8/2003 | Pu et al. .................... 438/122 |
| 6,649,108 B2 | | 11/2003 | McCullough et al. |
| 7,061,103 B2 | * | 6/2006 | Chen et al. ................. 257/713 |
| 7,205,653 B2 | * | 4/2007 | Brandenburg et al. ....... 257/714 |
| 7,787,254 B2 | | 8/2010 | Clayton et al. |
| 7,875,962 B2 | | 1/2011 | Balakrishnan et al. |
| 8,363,403 B2 | * | 1/2013 | Tonomoto .................. 361/699 |
| 2004/0042178 A1 | * | 3/2004 | Gektin et al. ............... 361/705 |
| 2004/0065964 A1 | | 4/2004 | Lee et al. |
| 2004/0074630 A1 | * | 4/2004 | Sen et al. ..................... 165/46 |
| 2009/0120607 A1 | | 5/2009 | Cheon et al. |
| 2010/0175852 A1 | | 7/2010 | Peterson |

OTHER PUBLICATIONS

Ellsworth et al., "Cooling Package With Flow-through Heat Sinks for Single and Multi-Chip Microelectronic Circuit Modules", IP.com Prior Art Database, Aug. 1, 1991, pp. 1-5, IP.com, USA.
Lee et al., "Package Embedded Heat Exchanger for Stacked Multi-Chip Module", The 12$^{th}$ International Conference on Solid State Sensors, Actuators and Microsystems, Jun. 8-12, 2003, Boston.
Mamunya et al., "Electrical and Thermal Conductivity of Polymers Filled With Metal Powders", European Polymer Journal 38, Feb. 2002, pp. 1887-1897, Elsevier Science Ltd, Ukraine.
"Thermally Conductive Polymers—CoolPoly Thermally Conductive Plastics", www.coolpolymers.com [online], 2011 [accessed online on Jun. 16, 2011].

* cited by examiner

*Primary Examiner* — Edmund H. Lee
(74) *Attorney, Agent, or Firm* — Edward J. Lenart; Katherine S. Brown; Biggers Kennedy Lenart Spraggins LLP

(57) ABSTRACT

Methods, apparatuses, and computer program products for forming an overmolded dual in-line memory module (DIMM) cooling structure are provided. Embodiments include identifying, by a tagging module, contextual information indicating circumstances in which the photograph was taken; based on the contextual information, selecting, by the tagging module, candidate profiles from a plurality of friend profiles associated with a profile of a user; and suggesting, by the tagging module to the user, the selected candidate profiles as potential friends to tag in the photograph.

9 Claims, 9 Drawing Sheets

METHOD OF FORMING AN OVERMOLDED DUAL IN-LINE MEMORY MODULE COOLING STRUCTURE

BACKGROUND OF THE INVENTION

1. Field of the Invention

The field of the invention is data processing, or, more specifically, methods and apparatuses forming an overmolded dual in-line memory module (DIMM) cooling structure.

2. Description of Related Art

Many advances have been made in the removal of heat generated by electrical components of computing systems. One such advancement is in the use of cooling pipes to transfer cooled liquid near heat generating components. Recently, cooling pipes have been used to cool dual in-line memory modules (DIMMs). However, in many systems, the DIMMs are coupled to the cooling pipes using thermal interface material, heat spreaders, and latches that make removal and installation of DIMMs difficult for a typical user.

SUMMARY OF THE INVENTION

Methods, apparatuses, and computer program products for forming an overmolded dual in-line memory module (DIMM) cooling structure are provided. Embodiments include identifying, by a tagging module, contextual information indicating circumstances in which the photograph was taken; based on the contextual information, selecting, by the tagging module, candidate profiles from a plurality of friend profiles associated with a profile of a user; and suggesting, by the tagging module to the user, the selected candidate profiles as potential friends to tag in the photograph.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
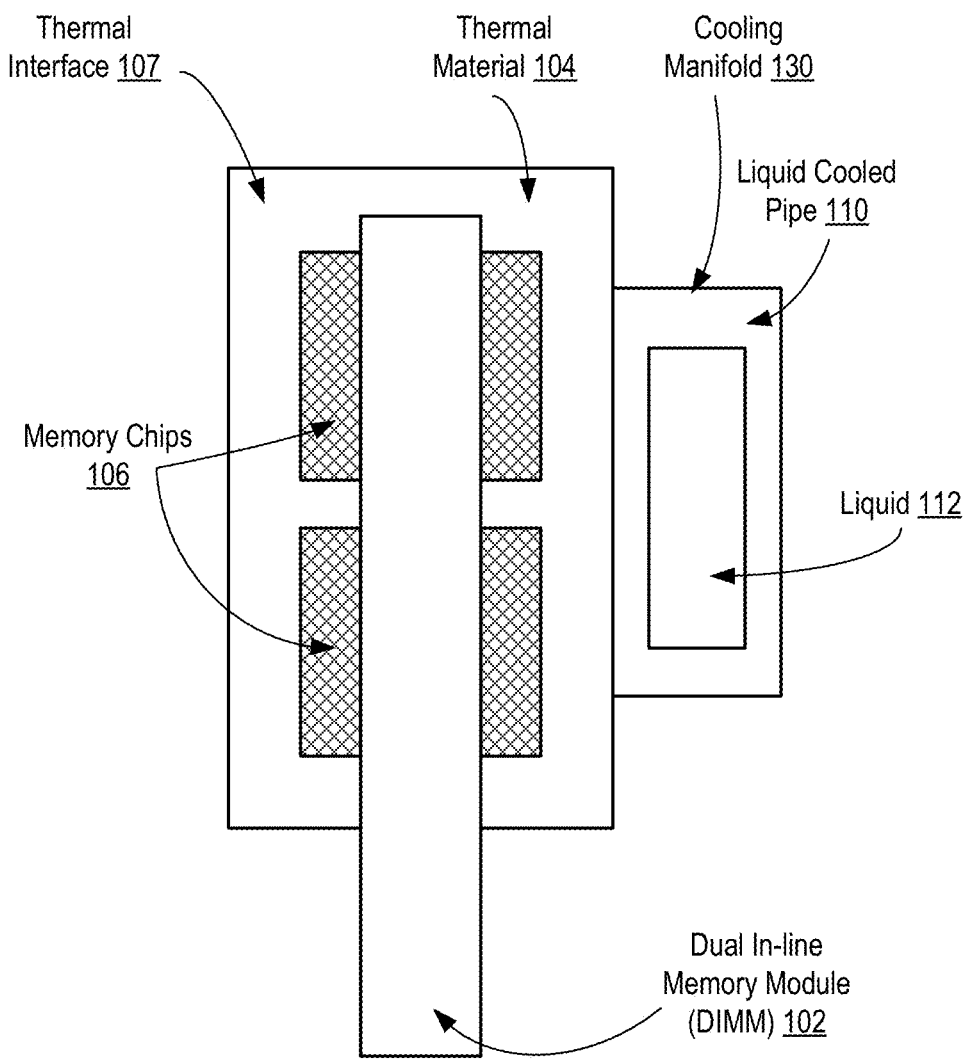
FIG. 1 sets forth a diagram of an exemplary apparatus forming an overmolded DIMM cooling structure according to embodiments of the present invention.

Exemplary methods and apparatuses forming an overmolded dual in-line memory module (DIMM) cooling structure in accordance with the present invention are described with reference to the accompanying drawings, beginning with FIG. 1. FIG. 1 sets forth a diagram of an exemplary apparatus forming an overmolded DIMM cooling structure according to embodiments of the present invention.

The example apparatus of FIG. 1 includes a DIMM (102) with four memory chips (106) attached. The memory chips of a DIMM may comprise a series of dynamic random access memory integrated circuits. Surrounding the portion of the DIMM (102) with the attached memory chips (106) is a thermal material (104). Thermal material may be injectable/castable thermal material (ICTM). Examples of thermal material include a thermal plastic. The thermal material (104) of FIG. 1 is part of a thermal interface (107) that is used for transferring heat from the DIMM (102) to a cooling manifold (130) that includes one or more liquid cooled pipes (110). A liquid cooled pipe (110) is used for transporting cooled liquid (112). The thermal material (104) is compliant enough so that it will compress when installed against a cold cooling manifold (130) with the liquid (112) flowing through the liquid cooled pipes (110).

In the example of FIG. 1, the thermal material (104) encapsulates the DIMM (102), conducting heat generated by the DIMM (102) to the cooling manifold (130). Having the thermal material (104) encapsulate the DIMM (102) eliminates the need for thermal interface material (TIM) to be applied to the DIMM (102). In addition, metal spreader plates and retention clips that are commonly attached to DIMMs may also be eliminated according to the embodiments of the present invention because the heat is transferred via the encapsulating thermal material (104).

Another advantage of the present invention is that the apparatus of FIG. 1 can accommodate a wide variation in DIMM thickness as well as dimensional variation of the parts to which the apparatus couples. This is a major advantage when the DIMM pitch is small and the metal spreading structures are large. Because the thermal material is compliant, it acts as a spring to apply pressure to the cooling manifold that it is pushed against. The casting or molding process used to encapsulate the DIMM (102) with the thermal material (104) provides a much larger conduction area than is usually accomplished by placing TIM on top of each memory chip. This is because the molding process ensures there is conductive material applied to all of the surfaces of the DIMM resulting in the lowest thermal impedance. An advantage of insert molding a conductive material, such as the thermal material, on to a DIMM is that the thickness of all the molded assemblies will be the same. An additional advantage of the present invention is that customers can install and replace overmolded DIMMs on their own without having to be concerned with placing TIM on replacement DIMMs.

Figure 2:
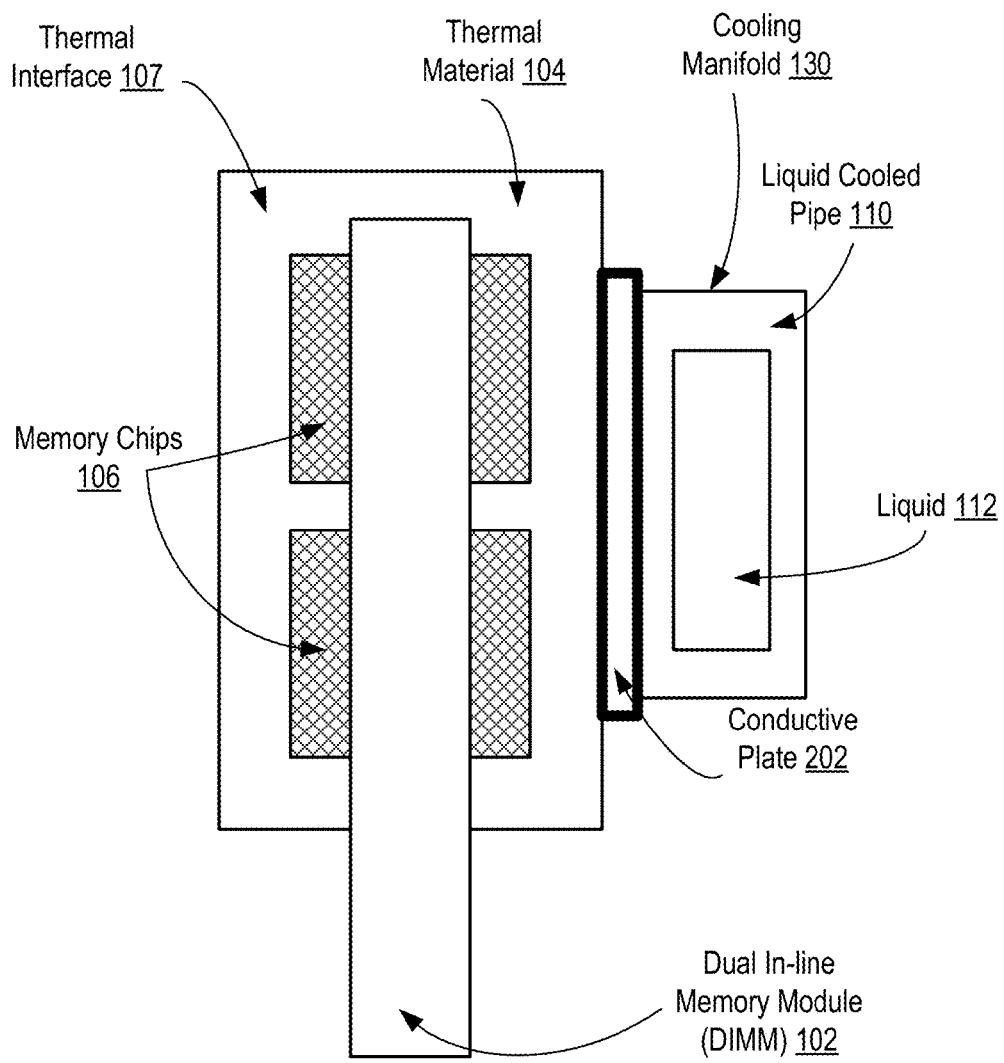
FIG. 2 sets forth a diagram of a further exemplary apparatus forming an overmolded DIMM cooling structure according to embodiments of the present invention.

For further explanation, FIG. 2 sets forth a diagram of a further exemplary apparatus forming an overmolded dual in-line memory module (DIMM) cooling structure according to embodiments of the present invention. The apparatus of FIG. 2 is similar to the apparatus of FIG. 1 in that the apparatus of FIG. 2 includes a DIMM (102) with memory chips (106) attached, thermal material (104) that encompasses the DIMM (102), and a cooling manifold (130) with liquid cooled pipes (110) for transporting cooled liquid (110).

In the example apparatus of FIG. 2, however, a conductive plate (202) is coupled to the thermal material (104). The conductive plate (202) may be used to improve the contact between the thermal material (104) and the cooling manifold (130). That is, the conductive plate (202) improves thermal conductivity between the thermal interface (107) and the cooling manifold. Improving thermal conductivity of the thermal interface (104) may be desired especially in situations where only one access point to the cooling manifold is available, as is illustrated in FIGS. 1-3.

Figure 3:
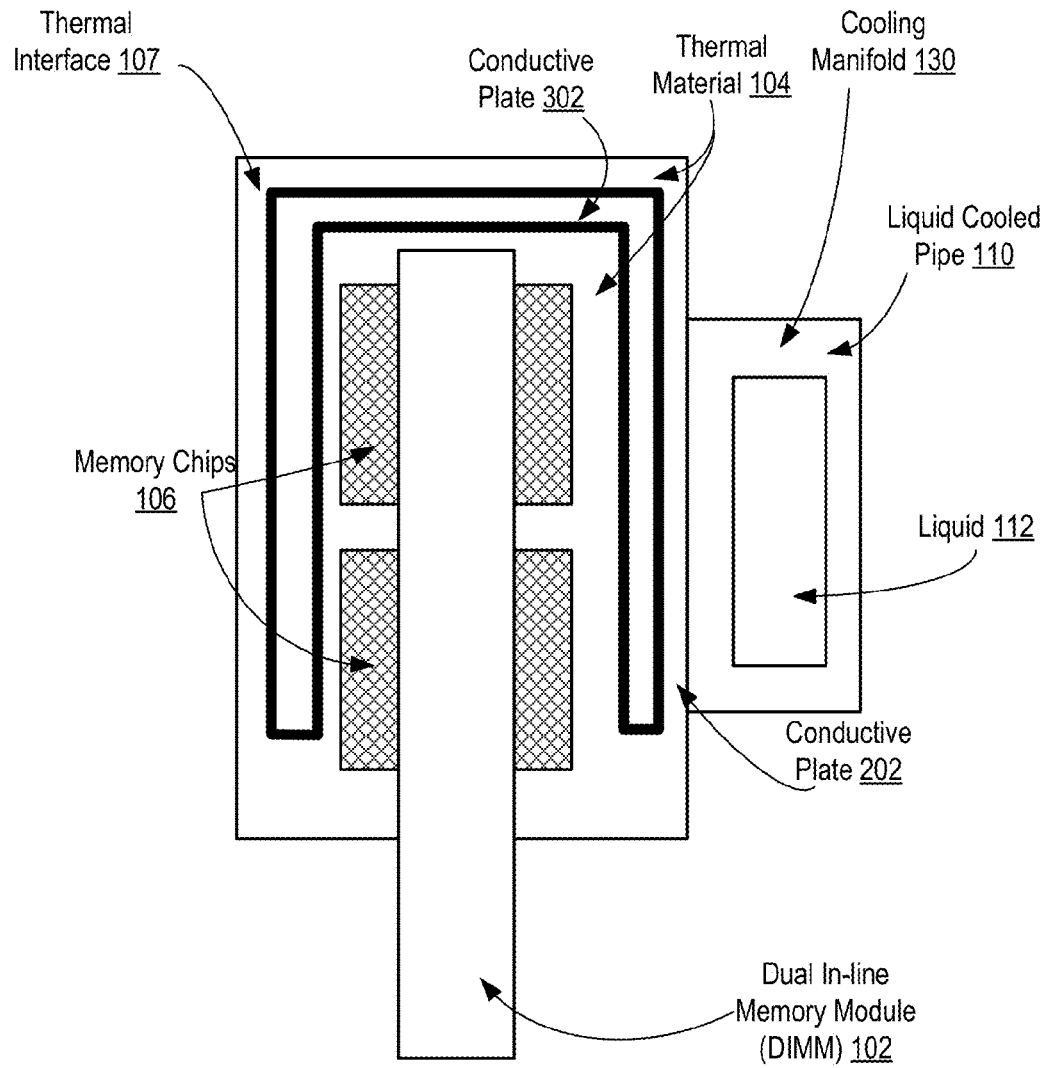
FIG. 3 sets forth a diagram of a further exemplary apparatus forming an overmolded DIMM cooling structure according to embodiments of the present invention.

For further explanation, FIG. 3 sets forth a diagram of a further exemplary apparatus forming an overmolded DIMM cooling structure according to embodiments of the present invention. The apparatus of FIG. 3 is similar to the apparatus of FIG. 1 in that the apparatus of FIG. 3 includes a DIMM (102) with memory chips (106) attached, thermal material (104) that encompasses the DIMM (102), and a cooling manifold (130) with liquid cooled pipes (110) for transporting cooled liquid (110).

In the example apparatus of FIG. 3, however, a conductive plate (302) is incorporated into to the thermal material (104). The conductive plate (302) of FIG. 3 may be used to improve the thermal conductivity within the thermal material (104).

That is, the conductive plate (202) helps the thermal interface (107) of the apparatus transfer heat from the DIMM to the cooling manifold.

Figure 4A:
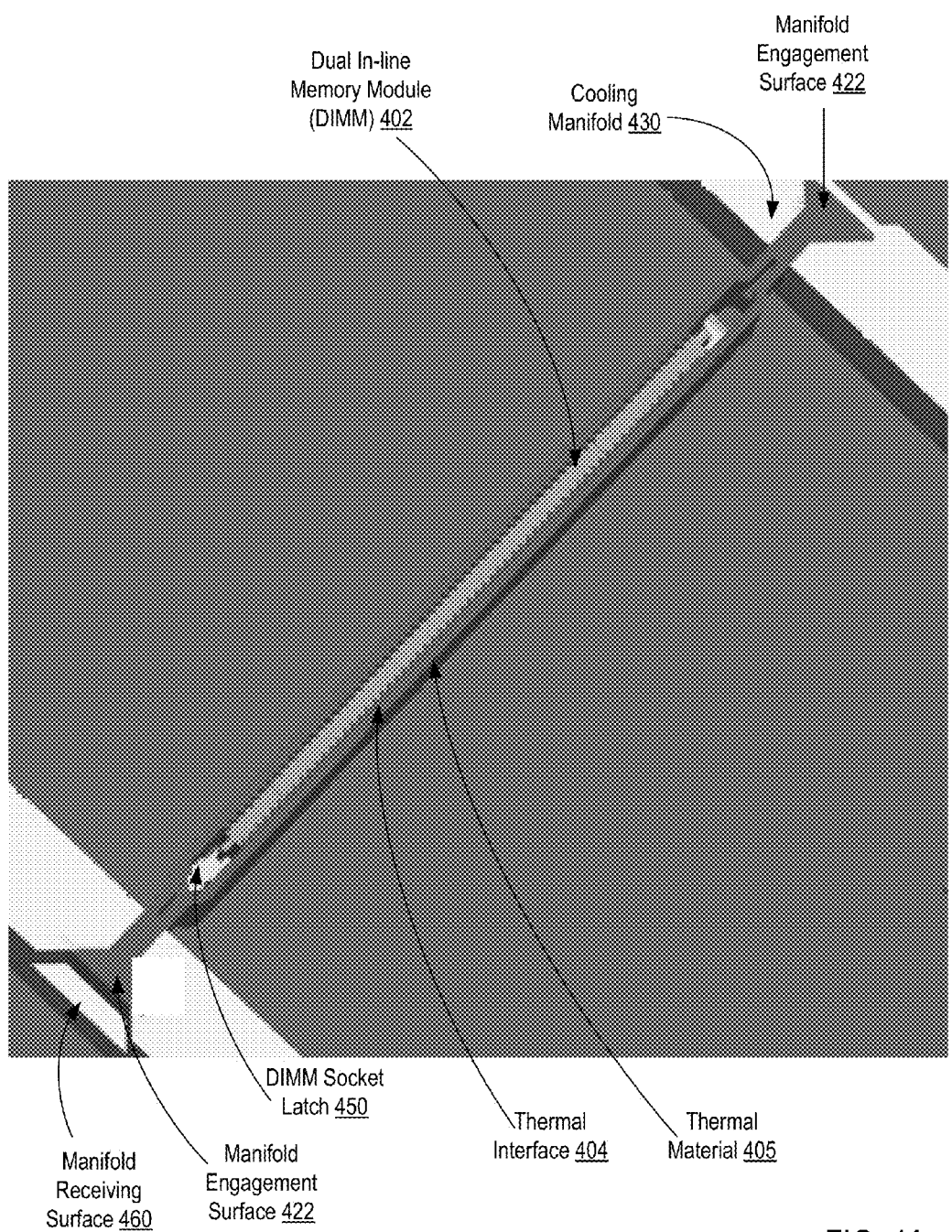
FIG. 4A sets forth a diagram of a further exemplary apparatus forming an overmolded DIMM cooling structure according to embodiments of the present invention.

For further explanation, FIG. 4A sets forth a diagram of a further exemplary apparatus forming an overmolded DIMM cooling structure according to embodiments of the present invention. The example apparatus of FIG. 4A includes a DIMM (402) that is surrounded by a thermal material (405). The apparatus of FIG. 4A also includes a DIMM socket latch (450) for coupling the DIMM (402) into the thermal interface (404). That is, unlike the apparatuses of FIGS. 1-3, the DIMM (402) is removable from the thermal interface (404). This may be advantageous for a user wishing to only replace the DIMM and not the thermal material. The thermal material (405) of FIG. 4A is part of a thermal interface (404) that is used for transferring heat from the DIMM (402) to a cooling manifold (430). Thermal material may be injectable/castable thermal material (ICTM). The thermal material (405) is compliant enough so that it will compress when the thermal interface (404) is installed against a cold cooling manifold (430) with the liquid flowing through the liquid cooled pipes.

In the example of FIG. 4A, at each end of the thermal material (405) is a manifold engagement surface (422) for locking the thermal interface (404) to a manifold receiving surface (460) of a cooling manifold (430). That is, the manifold engagement surface (422) is shaped to fit with the manifold receiving surface (460). To lock the manifold engagement surface (422) of the thermal interface (404) to the manifold receiving surface (460) of the cooling manifold (430), the thermal material (405) is stretched until both ends of the manifold engagement surfaces (422) are connected to their corresponding manifold receiving surfaces (460). When the thermal material (405) is stretched, the thermal material (405) compresses around the memory chips (not shown) attached to the DIMM (402). As the compression of the thermal material (405) increases, the thermal conductivity of the thermal material (405) increases.

Figure 4B:
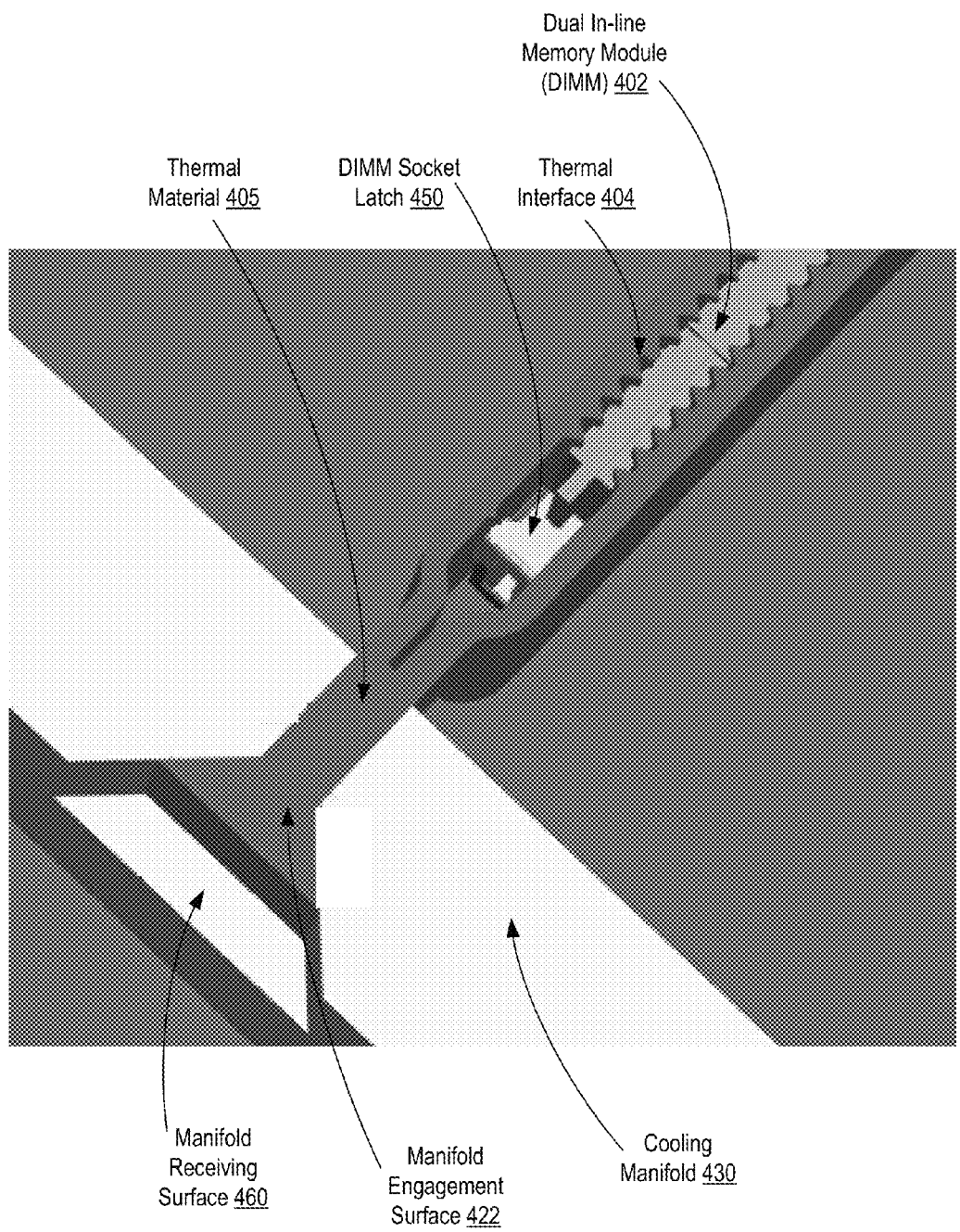
FIG. 4B sets forth a diagram of an alternative view of the apparatus of FIG. 4A forming an overmolded DIMM cooling structure according to embodiments of the present invention.

FIG. 4B sets forth a diagram of an alternative view of the apparatus of FIG. 4A forming an overmolded DIMM cooling structure according to embodiments of the present invention. That is, the apparatus of FIG. 4B includes the following elements of the apparatus of FIG. 4A: a DIMM (402) encompassed by a thermal material (405) of a thermal interface (404); a DIMM socket latch (450) for locking the DIMM into the thermal interface (404); and thermal material (405) having manifold engagement surfaces (422) for locking the thermal interface (404) to manifold receiving surfaces (460) of a cooling manifold (430). The alternative view illustrated in FIG. 4B, shows the thermal interface (404) being stretched to connect the manifold engagement surface (422) with the manifold receiving surface (460).

Figure 5:
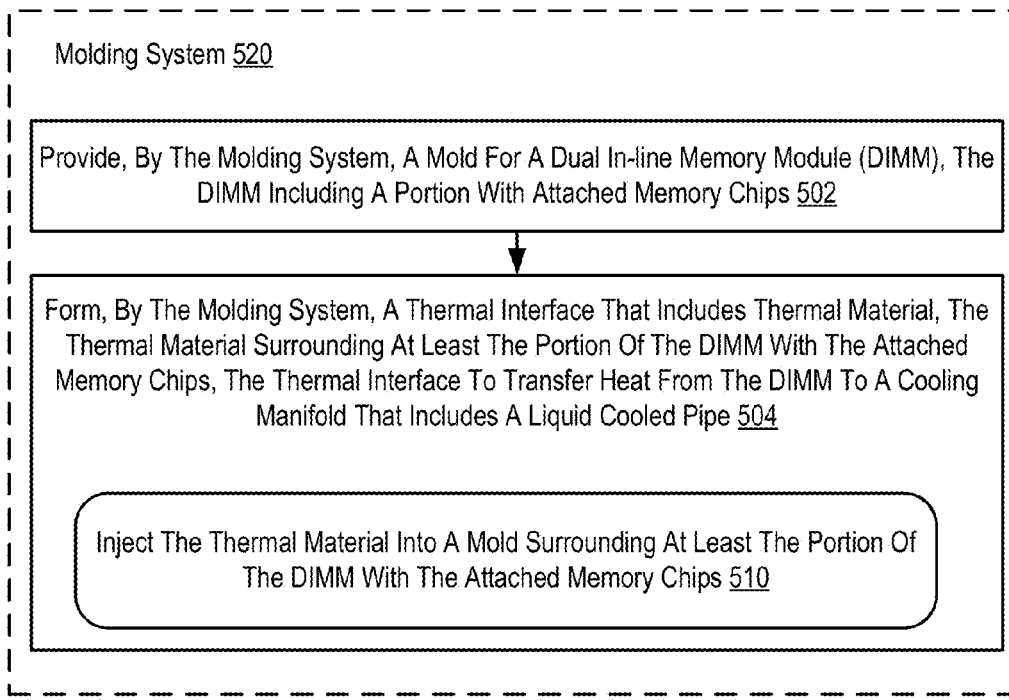
FIG. 5 sets forth a flow chart illustrating an exemplary method for forming an overmolded dual in-line memory module (DIMM) cooling structure according to embodiments of the present invention.
Figure 5:
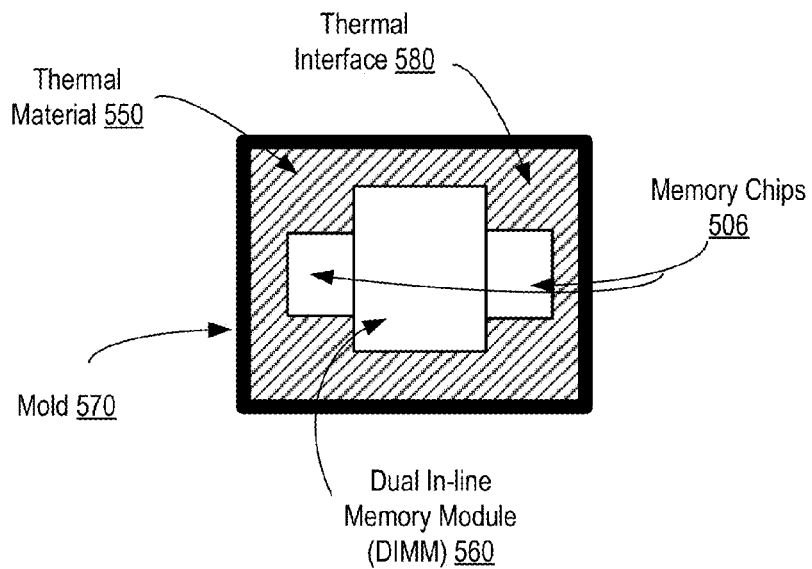

For further explanation, FIG. 5 sets forth a flow chart illustrating an exemplary method for forming an overmolded dual in-line memory module (DIMM) cooling structure according to embodiments of the present invention. The method of FIG. 5 includes providing (502), by a molding system (520), a mold (570) for a DIMM (560), the DIMM (560) including a portion with attached memory chips (506). A mold is a hollowed out space for receiving injectable thermal material. Providing (502) a mold (570) for a DIMM (560) may be carried out by determining a size for the mold such that the hollowed out area of the mold creates a cavity larger than a DIMM; and creating the mold (570) in accordance with the determined size.

The method of FIG. 5 also includes forming (504), by the molding system (520), a thermal interface (580) that includes thermal material (550), the thermal material (550) surrounding at least the portion of the DIMM (502) with the attached memory chips (506), the thermal interface (580) to transfer heat from the DIMM (502) to a cooling manifold. Forming (504) a thermal interface (580) that includes thermal material (550) may be carried out by placing the DIMM in the mold; and pouring the thermal material into the mold.

In the method of FIG. 5, forming (504) a thermal interface (580) that includes thermal material (550) may optionally include injecting (510) the thermal material (550) into a mold (570) surrounding at least the portion of the DIMM (502) with the attached memory chips (506). Injecting (510) the thermal material (550) into a mold (570) surrounding at least the portion of the DIMM (502) with the attached memory chips (506) may be carried out by heating the thermal material into a liquid; and cooling the thermal material until the thermal material hardens sufficiently.

Figure 6:
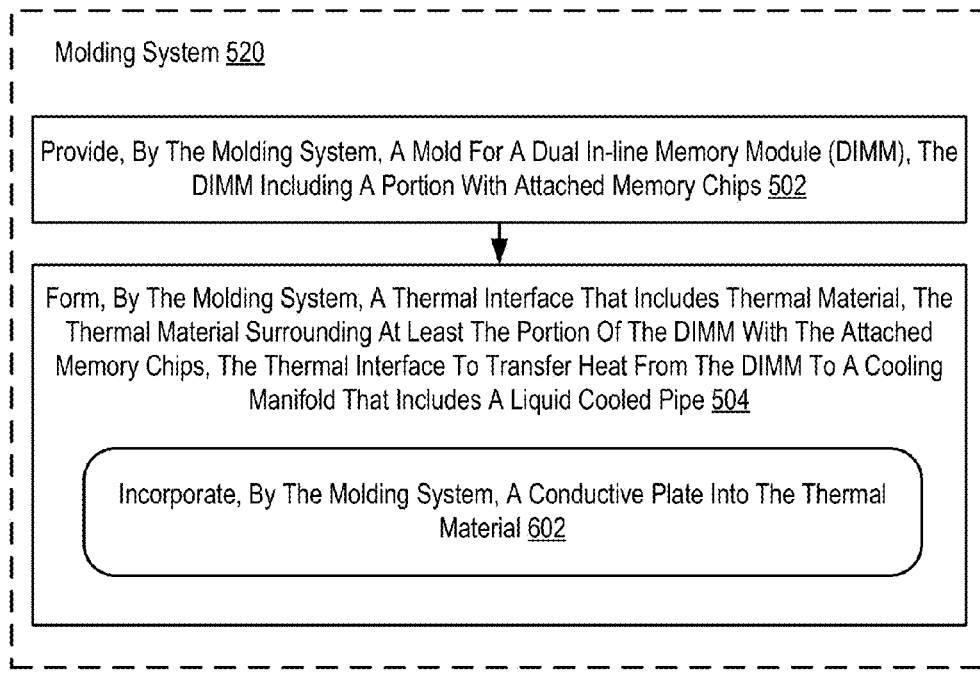
FIG. 6 sets forth a flow chart illustrating a further exemplary method for forming an overmolded dual in-line memory module (DIMM) cooling structure according to embodiments of the present invention.
Figure 6:
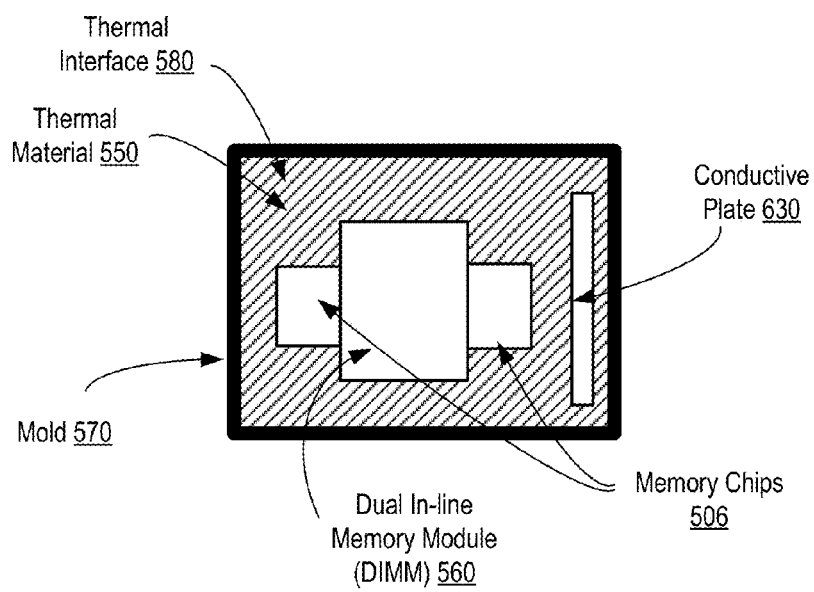

For further explanation, FIG. 6 sets forth a flow chart illustrating a further exemplary method for forming an overmolded dual in-line memory module (DIMM) cooling structure according to embodiments of the present invention. The method of FIG. 6 is similar to the method of FIG. 5 in that the method of FIG. 6 also includes: providing (502), by a molding system (520), a mold (570) for a DIMM (560); and forming (504), by the molding system (520), a thermal interface (580) that includes thermal material (550).

In the method of FIG. 6, however, forming (504) a thermal interface (580) that includes thermal material (550) includes incorporating (602), by the molding system (520), a conductive plate (630) into the thermal material (405). Incorporating (602) a conductive plate (630) into the thermal material (405) may be carried out by placing the conductive plate into the thermal material before the thermal material completely cools and hardens in the mold.

Figure 7:
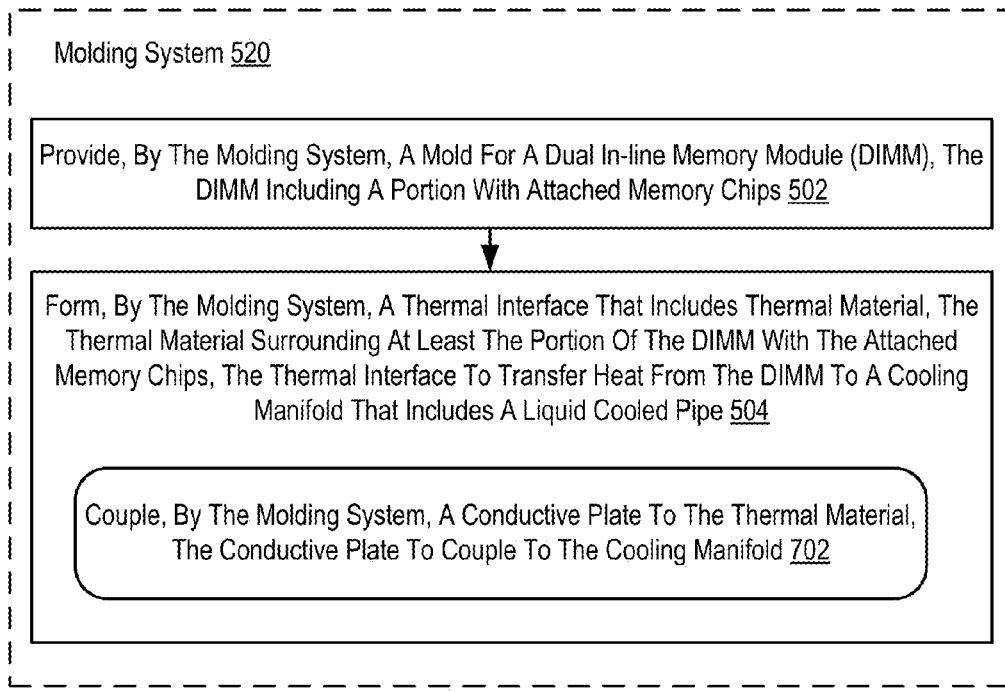
FIG. 7 sets forth a flow chart illustrating a further exemplary method for forming an overmolded dual in-line memory module (DIMM) cooling structure according to embodiments of the present invention.
Figure 7:
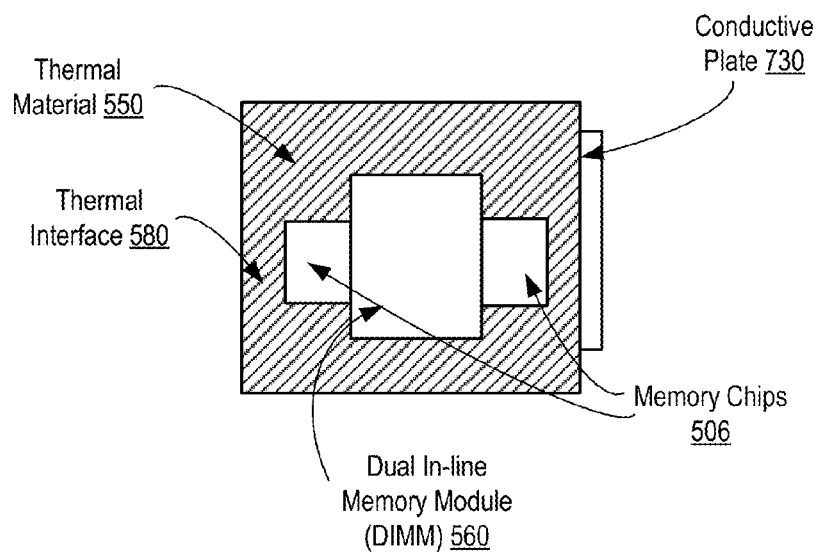

For further explanation, FIG. 7 sets forth a flow chart illustrating a further exemplary method for forming an overmolded dual in-line memory module (DIMM) cooling structure according to embodiments of the present invention. The method of FIG. 6 is similar to the method of FIG. 5 in that the method of FIG. 6 also includes: providing (502), by a molding system (520), a mold (570) for a DIMM (560); and forming (504), by the molding system (520), a thermal interface (580) that includes thermal material (550).

In the method of FIG. 7, however, forming (504) a thermal interface (580) that includes thermal material (550) includes coupling (702), by the molding system, a conductive plate (730) to the thermal material (550), the conductive plate (730) to couple to a cooling manifold. Coupling (702) a conductive plate (730) to the thermal material (550) may be carried out by attaching the conductive plate to the thermal material after the thermal material has cooled and is removed from the mold; or alternatively, attaching the conductive plate to the thermal material during the molding process.

Figure 8:
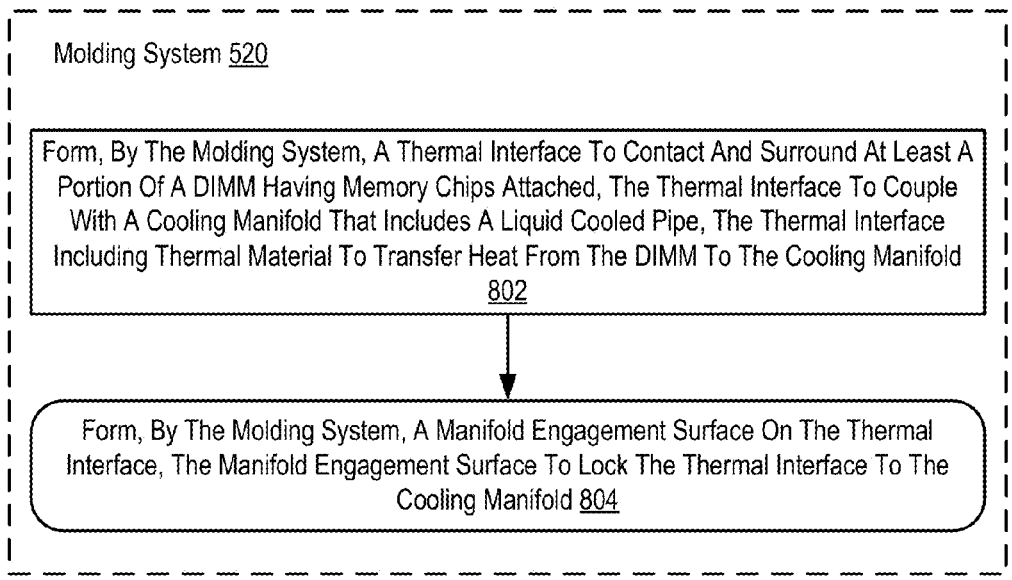
FIG. 8 sets forth a flow chart illustrating a further exemplary method for forming an overmolded dual in-line memory module (DIMM) cooling structure according to embodiments of the present invention.
Figure 8:
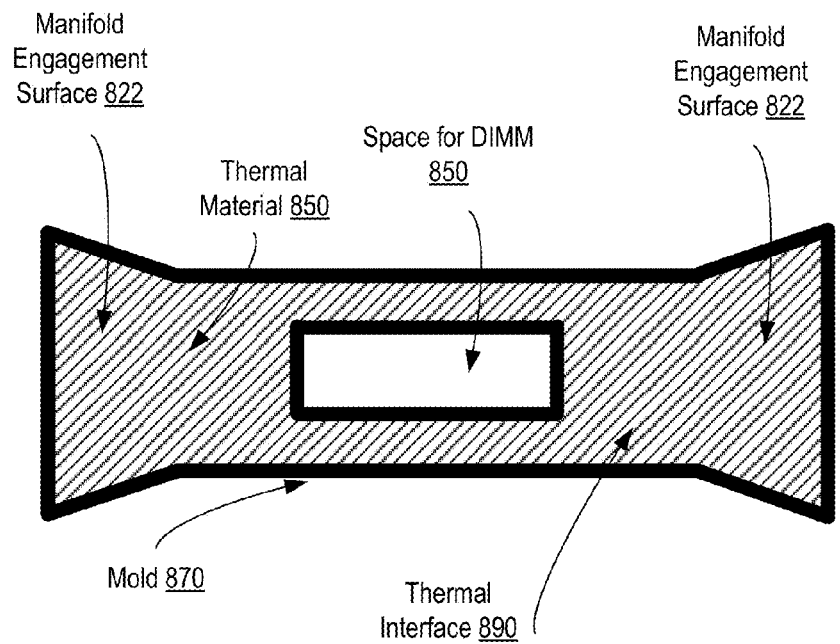

For further explanation, FIG. 8 sets forth a flow chart illustrating a further exemplary method for forming an overmolded dual in-line memory module (DIMM) cooling structure according to embodiments of the present invention. The method of FIG. 8 includes forming (802), by the molding system (520), a thermal interface (890) to contact and surround at least a portion of a DIMM having memory chips attached. The thermal interface (890) is used to couple a DIMM to a cooling manifold that includes a liquid cooled pipe. The thermal interface (890) includes thermal material (850) to transfer heat from the DIMM to the cooling manifold. Forming (802) a thermal interface (890) to contact and surround at least a portion of a DIMM having memory chips attached may be carried out by placing the DIMM in the mold; and pouring the thermal material into the mold.

The method of FIG. 8 may optionally include forming (804), by the molding system (520), a manifold engagement surface (822) on the thermal interface (890). The manifold engagement surface (822) is used to lock the thermal interface (890) to a cooling manifold. Forming (804) a manifold engagement surface (822) on the thermal interface (890) may be carried out by creating a mold that is shaped like the inside of a manifold receiving surface of a cooling manifold; and injecting thermal material into the mold.

Readers of skill in the art will recognize that the cooling system (520) of FIGS. 5-8 may include computer program instructions that are disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of forming an overmolded dual in-line memory module (DIMM) cooling structure, the method comprising:
    providing, by a molding system, a mold for a DIMM, the DIMM including a portion with attached memory chips; and
    forming, by the molding system, a thermal interface that includes thermal material, the thermal material surrounding at least the portion of the DIMM with the attached memory chips, the thermal interface to transfer heat from the DIMM to a cooling manifold, wherein the cooling manifold is a liquid pipe.

2. The method of claim 1 wherein forming the thermal interface includes coupling, by the molding system, a conductive plate to the thermal material, the conductive plate to couple to the cooling manifold.

3. The method of claim 1 wherein forming the thermal interface includes incorporating, by the molding system, a conductive plate into the thermal material.

4. The method of claim 1 wherein forming the thermal interface includes injecting the thermal material into a mold surrounding at least the portion of the DIMM with the attached memory chips.

5. A method of forming an overmolded dual in-line memory module (DIMM) cooling structure, the method comprising:
    forming, by the molding system, a thermal interface to contact and surround at least a portion of a DIMM having memory chips attached;
    the thermal interface to couple with a cooling manifold that includes a liquid cooled pipe, the thermal interface including thermal material to transfer heat from the DIMM to the cooling manifold.

6. The method of claim 5 further comprising forming, by the molding system, a manifold engagement surface on the thermal interface, the manifold engagement surface to lock the thermal interface to the cooling manifold.

7. The method of claim 6 wherein the manifold engagement surface locks with the cooling manifold when the thermal interface is stretched.

8. The method of claim 5 wherein when the thermal interface is stretched, the thermal material compresses around the memory chips attached to the DIMM.

9. The method of claim 5 wherein forming the thermal interface includes injecting the thermal material into a mold.

* * * * *